United States Patent
Granovsky et al.

(10) Patent No.: US 7,657,851 B2
(45) Date of Patent: Feb. 2, 2010

(54) DEVICE, SYSTEM, AND METHOD FOR CORRECTION OF INTEGRATED CIRCUIT DESIGN

(75) Inventors: Ilya Granovsky, Haifa (IL); Boaz Yeger, Zichron Yaacov (IL)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 11/771,152

(22) Filed: Jun. 29, 2007

(65) Prior Publication Data

US 2009/0007034 A1    Jan. 1, 2009

(51) Int. Cl.
*G06F 17/50*    (2006.01)
(52) U.S. Cl. .............................................. 716/4; 716/18
(58) Field of Classification Search .................. None
See application file for complete search history.

(56) References Cited

U.S. PATENT DOCUMENTS

| | | | | |
|---|---|---|---|---|
| 5,249,133 A | * | 9/1993 | Batra | 716/5 |
| 6,904,576 B2 | * | 6/2005 | Ng et al. | 716/4 |
| 7,240,316 B2 | * | 7/2007 | Regnier | 716/11 |
| 7,441,215 B1 | * | 10/2008 | Sahrling | 716/5 |
| 2004/0030999 A1 | | 2/2004 | Ng et al. | |

OTHER PUBLICATIONS

Yang, Yu-Sen, et al., "Extraction Error Modeling and Automated Model Debugging in High-Performance Custom Designs", IEEE Transactions on Very Large Scale Integration (VLSI) Systems, Jul. 2006, pp. 763-776, v 14, n 7.

* cited by examiner

*Primary Examiner*—Leigh Marie Garbowski
(74) *Attorney, Agent, or Firm*—Suzanne Erez (57) ABSTRACT

Device, system and method of correcting an integrated circuit design. For example, a method includes receiving a list of one or more root points for an active netlist that requires logic correction, wherein the root points correlate between elements of the active netlist and elements of a re-synthesized netlist that is based on a high-level correction for the integrated circuit design; automatically identifying in the active netlist a driving logic cone for at least one of the root points; and automatically identifying in the re-synthesized netlist a driving logic cone for the respectively correlated root point, including one or more corrected logic elements that correspond to the one or more identified flawed logic elements.

20 Claims, 8 Drawing Sheets

DEVICE, SYSTEM, AND METHOD FOR CORRECTION OF INTEGRATED CIRCUIT DESIGN

FIELD OF THE INVENTION

Some embodiments of the invention relate to the field of integrated circuit (IC) design.

BACKGROUND OF THE INVENTION

A design specification for an integrated circuit (IC) or application-specific integrated circuit (ASIC) may be translated into a register transfer level (RTL) description of the circuit. The RTL description is a high-level representation of the circuit design written in a hardware description language (HDL) to represent the intended circuit behavior. After logical verification of the RTL design, a gate level representation or "netlist" of the circuit is derived or synthesized from the RTL description, and used in design of the physical circuit layout.

Unfortunately, functional errors or inconsistencies in the circuit behavior are sometimes detected only late in the design stage, when the netlist undergoes final processing for production. At this stage, which may be referred to as a "post-freeze" stage, a restart of the final processing flow may lead to critical delays in release of the circuit design for production, and may require time-consuming and costly application of gate level corrections to the netlist during pre-production processing. Such delays due to errors or inconsistencies significantly delay production of the circuit, and thus increase the project's overall cost.

SUMMARY OF THE INVENTION

Some embodiments include devices, systems, and methods for correction of IC design, and/or for ASIC design flow gate level corrections utilizing cloned re-synthesized logic cones.

In some embodiments, a method of correcting an integrated circuit design utilizes a list of one or more root points for an active netlist that requires logic correction, wherein the root points correlate between elements of the active netlist and elements of a re-synthesized netlist that is based on a high-level correction for the integrated circuit design.

The method includes, for example, automatically identifying in the active netlist one or more flawed logic elements associated with at least one of the root points; and automatically identifying in the re-synthesized netlist one or more corrected logic elements that correspond to the one or more identified flawed logic elements. Automatically identifying one or more elements associated with a root point includes, for example, identifying a driving logic cone for the root point.

In some embodiments, the method further includes automatically correcting the active netlist based on the one or more corrected logic elements of the re-synthesized netlist, for example, by removing one or more of the flawed logic elements from the active netlist and inserting one or more of the corrected logic elements into the active netlist.

Removing includes, for example, deleting one or more of the flawed logic elements that are associated only with root points of the active netlist; and disconnecting one or more of the flawed logic elements that are further associated with non-flawed logic points in the active netlist.

In some embodiments, the corrected logic elements are cloned for insertion into the active netlist. Cloning includes, for example, copying the corrected logic elements from the re-synthesized netlist and applying a unique naming scheme.

Some embodiments include, for example, a computer program product including a computer-useable medium that includes a computer-readable program which, when executed on a computer, causes the computer to perform methods in accordance with some embodiments of the invention.

Embodiments of the invention may provide other and/or additional benefits and/or advantages.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Further, reference numerals may be repeated among the figures to indicate corresponding or analogous elements. Moreover, some of the blocks depicted in the drawings may be combined into a single function. The figures are listed below.

DETAILED DESCRIPTION

In the following detailed description, numerous specific details are set forth in order to provide a thorough understanding of some embodiments of the invention. However, it will be understood by persons of ordinary skill in the art that embodiments may be practiced without these specific details. In other instances, well-known methods, procedures, components, units and/or circuits have not been described in detail so as not to obscure the discussion. It is intended that the embodiments and figures disclosed herein be considered illustrative rather than restrictive.

Portions of the discussion herein utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices. In addition, the term "plurality" may be used herein to describe two or more items; for example, a plurality of items includes two or more items.

Embodiments of the invention may include apparatuses for performing the operations herein. An apparatus may be specially constructed for the desired purposes, or it may comprise a general-purpose computer selectively activated or reconfigured by a computer program stored in the computer. Such a computer program may be stored in a computer readable storage medium, such as, but not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions and capable of being coupled to a computer system bus.

The processes and displays presented herein are not inherently related to any particular computer or other apparatus. Various general-purpose systems may be used with programs in accordance with embodiments herein, or it may be convenient to construct a more specialized apparatus to perform desired methods. In addition, embodiments of the invention are not described with reference to any particular programming, scripting, modeling, and/or hardware description language. A variety of programming and other such languages may be used to implement embodiments of the invention.

As used herein, the terms "synthesis", "re-synthesis", "logic synthesis", "synthesizer", "logic synthesizer", and the like refer to conversion of a high-level circuit description, such as a register transfer level (RTL) description, into a netlist of logic gates and their interconnections, such as connecting wires and associated input/output pins. The netlist may also be referred to as a "gate level" description of the circuit design.

The terms "net", "cell", "gate", "sink", "wire", "port", "source", and/or "macro" are used herein to refer to elements of a netlist. Some of these terms may be interchangeable; for example, the terms "net" and "wire" may be interchangeable terms; and the terms "gate" and "cell" may be used in similar contexts.

The term "gate" as used herein refers to a netlist element having input and output port(s), where driving of the output port(s) may be implemented by a logical function of the input ports. "Source" output ports are ports that drive nets that are attached to them; whereas "sink" input ports are driven by nets that are attached to them. The terms "wire" or "net" as used herein refer to a conductive element connecting between ports of gates. A single source port may drive a net; whereas a net may drive multiple sink ports. The terms "fanout" or "fan-out" as used herein refer to a number of sink ("driven") ports connected to a net. As used herein, the terms "drive", "driving", "driven", "driving logic" and the like refer to a contribution to the logical function of a certain port (e.g., as opposed to electrical driving on a wire).

The term "logic cone" as used herein refers to a discrete set of logic in a circuit netlist, such as combinational or combinatorial logic, that is bounded by, for example, registers, input/output ports, memory elements, and/or hard macros. Typically, a logic cone has multiple inputs and one output. The term "macro" as used herein refers to a large or complex netlist element, or to a sequence of network elements. The term "cell" as used herein refers to an ASIC gate, or to a building unit of an ASIC gate.

As used herein, the terms "cloning", "logic cloning" and the like refer to copying, duplicating, and/or replicating a portion of a netlist ("original logic"), such as a logic cone, to produce a substantially identical version ("cloned logic"). The cloned logic is logically substantially equivalent to the original logic, but may include changes as in the names of one or more elements.

As an overview, some embodiments of the invention include tools for automated gate level corrections or fixes in an application-specific integrated circuit (ASIC) design flow. Examples of such tools include netlist modification scripts such as, for example, Tool Command Language (Tcl) scripts, which may be used to remove and/or clone logic gates in a netlist and may be applied independently of other netlist processing activities. This allows, for example, application of several gate level corrections substantially in parallel or substantially simultaneously. In some embodiments, the automated tools support evaluation of the impact of a possible gate level correction on a netlist, for example, in terms of the number of gates to be removed, new wiring required, and the like, without actual modification of the active netlist.

In some embodiments, a method of automated gate level corrections automatically identifies and removes flawed logic gates from a production netlist and inserts correct logic, which is cloned from a re-synthesized netlist and based on a modified RTL description or other high-level design fix. Netlist elements such as hard macros, memory arrays and latches are typically preserved during re-synthesis, for example, when using various suitable synthesis tools and design methodologies and are therefore matched between the production netlist and the re-synthesized netlist. The preserved cells, also referred to herein as "fixed cells" or "root points", provide footing for the automatic gate level corrections, and are used as a reference between production netlist and the re-synthesized netlist, to properly clone circuit logic. Root points may correlate between an active netlist and a reference netlist, such as a re-synthesized netlist.

In some embodiments, re-synthesis is performed efficiently, for example, by using only relevant logic partitions of the RTL such that, when the partition is synthesized, the resultant netlist fully contains an impacted logic cone with surrounding fixed cells and root points, and is used to accurately generate or clone the circuit logic by providing a reference between the production netlist and the full re-synthesized netlist. In such embodiments, hierarchal naming extension rules are used to allow correspondence between fixed cells in the production netlist and the re-synthesized netlist.

Some embodiments include a methodology and set of automated tools for functional gate-level corrections of an integrated circuit design, including efficient implementation of large-scale gate level changes in ASIC design flow. For example, some embodiments allow to make complex design fixes during the last stages of an ASIC flow utilizing an automated translation to a gate-level netlist from a higher level of representation, such as the RTL description. The gate level corrections are performed, for example, by automatically extracting correct netlist portions from a re-synthesized design and cloning those portions to an active production netlist. The automated methodology and tools may significantly streamline the process of functional corrections in the post-design-freeze phase, which is a significant improvement over a manual correction approach, where complex and large-scale corrections may not be feasible.

At the post-design-freeze stage of ASIC design flow, corrections to the high-level design code are translated into equivalent gate-level modifications and implemented on a netlist that is already in active production. Typically, implementing such corrections is a complex manual process with limited ability to support design correction. Some embodiments include a methodology and tools to allow automated translation of a high-level design correction into a gate-level netlist change with proven Boolean equivalency, enabling, for example, complex ASIC flow gate level netlist corrections in the post-design-freeze stage, as the netlist undergoes final processing before production.

In contrast to a manual correction approach, which may be suitable only for limited-scale corrections (for example, less than a hundred gates), some embodiments of the invention allow rapid implementation of complex gate-level fixes, which may include modification of a thousand or more gates. Furthermore, an automated gate level approach allows for modifications of complex state machines, for example, counter logic modifications and/or data path structure modifications, which may not be feasible with a manual gate-level procedure. In addition, the automated gate-level corrections may be formally validated in terms of logical equivalence checking without the numerous iterations typical of a manual approach. Accordingly, some embodiments of the invention are suitable for post-design-freeze functional corrections of an IC design.

Figure 1:
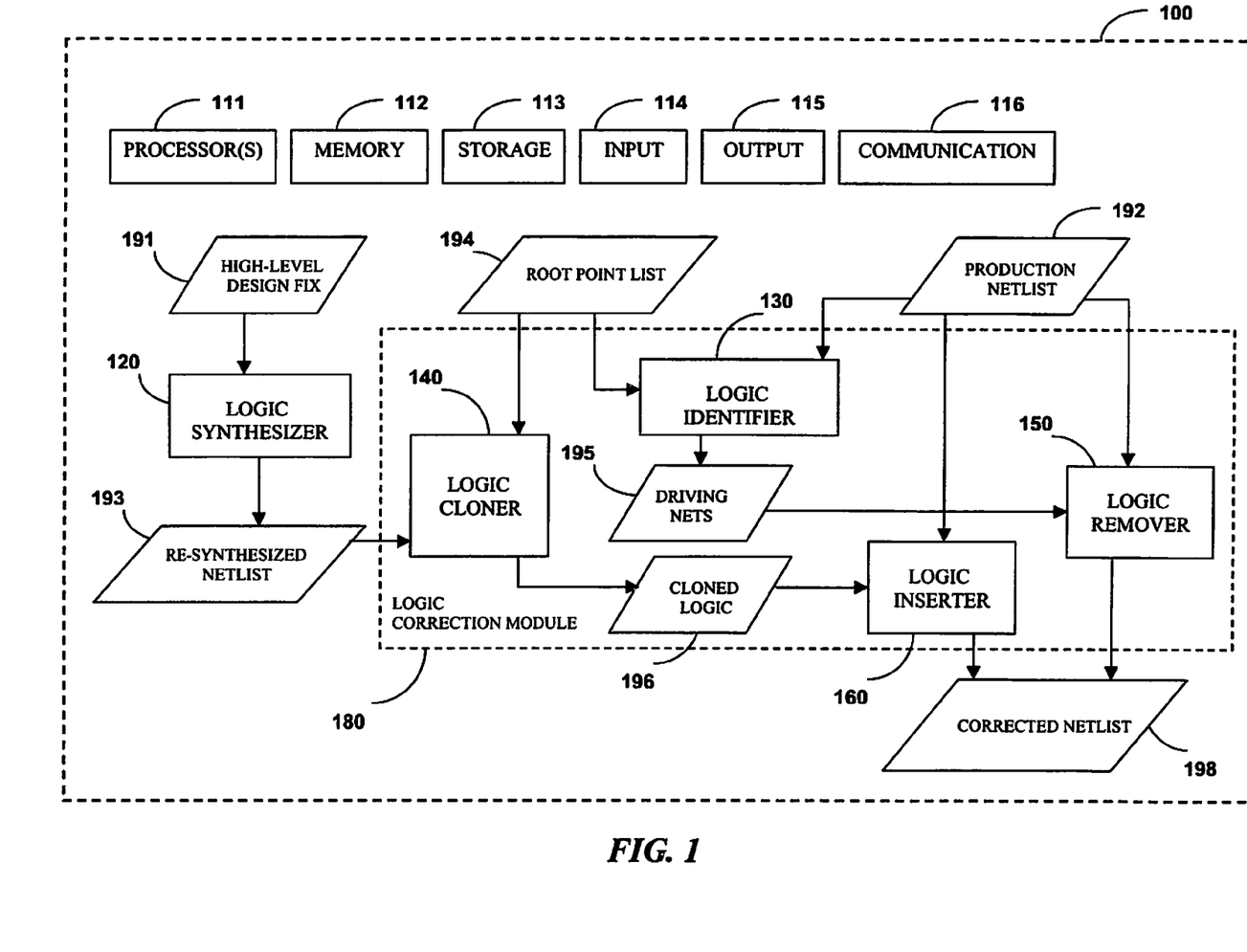
FIG. 1 is a schematic block diagram of a system for automated gate level corrections in an integrated circuit design in accordance with some demonstrative embodiments of the invention.

FIG. 1 schematically illustrates a system 100 for automated gate level corrections in an IC design in accordance with some demonstrative embodiments of the invention. System 100 may optionally be implemented or may operate, for example, using a computing system such as, for example, a computer, a personal computer (PC), a server computer, a computing device, a computing platform, a client/server system, a mobile computer, a portable computer, a laptop computer, a notebook computer, a tablet computer, or the like. System 100 may include, for example, one or more processors 111, a memory unit 112, a storage unit 113, an input unit 114, an output unit 115, and a communication unit 116. System 100 may include other suitable hardware components and/or software components Processor 111 may include, for example, a central processing unit (CPU), a digital signal processor (DSP), a microprocessor, a host processor, a controller, multiple processors or controllers, a chip, a microchip, one or more circuits, circuitry, a logic unit, an integrated circuit (IC), an application-specific integrated circuit (ASIC), or any other suitable multi-purpose or specific processor or controller. Processor 111 may, for example, execute instructions, process data, or execute one or more software applications.

Memory unit 112 may include, for example, a random access memory (RAM), a read only memory (ROM), a dynamic RAM (DRAM), a synchronous DRAM (SD-RAM), a flash memory, a volatile memory, a non-volatile memory, a cache memory, a buffer, a short term memory unit, a long term memory unit, or other suitable memory units or storage units. Memory unit 112 may be coupled to processor 111 by a system bus or other suitable interconnect. Storage unit 113 may include, for example, a hard disk drive, a floppy disk drive, a compact disk (CD) drive, a CD-ROM drive, a digital versatile disk (DVD) drive, or other suitable removable or non-removable storage units. Memory unit 112 and/or storage unit 113 may, for example, store data processed by system 100.

Input unit 114 may include, for example, a keyboard, a keypad, a mouse, a touch-pad, a stylus, a microphone, or other suitable pointing device or input device. Output unit 115 may include, for example, a cathode ray tube (CRT) monitor or display unit, a liquid crystal display (LCD) monitor or display unit, a screen, a monitor, a speaker, or other suitable display unit or output device. Communication unit 116 may include, for example, a wired or wireless network interface card (NIC), a wired or wireless modem, a wired or wireless receiver and/or transmitter, a wired or wireless transmitter-receiver and/or transceiver, a radio frequency (RF) communication unit or transceiver, or other units able to transmit and/or receive signals, blocks, frames, transmission streams, packets, messages and/or data.

In some embodiments, the components of system 100 may be enclosed in, for example, a common housing, packaging, or the like, and may be interconnected or operably associated using one or more wired or wireless links. In other embodiments, for example, components of system 100 may be distributed among multiple or separate devices, may be implemented using a client/server configuration or system, may communicate using remote access methods, or the like.

System 100 may be adapted to perform automated gate-level corrections in an IC and/or ASIC design flow. Accordingly, system 100 may include one or more hardware components and/or one or more software components able to perform one or more operations of the automated gate-level correction process. For example, in some embodiments, system 100 may include a logic synthesizer 120, a logic identifier 130, a logic cloner 140, a logic remover 150, and a logic inserter 160. In some embodiments, features of logic identifier 130, logic cloner 140, logic remover 150, and/or logic inserter 160 may be implemented in Tcl script form. In some embodiments, the various functions of components of system 100, as described herein, may be implemented in one or more multi-function hardware and/or software components. Furthermore, some or all of logic identifier 130, logic cloner 140, logic remover 150, and logic inserter 160 may be collectively referred to as a logic correction module 180.

In some embodiments, logic synthesizer 120 generates a re-synthesized netlist 193 for a circuit, based on a high-level design fix 191 such as a modified RTL description of the circuit design. The re-synthesized netlist 193 is a substantially complete netlist of the circuit design, or a partial netlist of the circuit, for example, reflecting only the relevant modified logic from the high-level design. Logic remover 150 and logic inserter 160 are applied to a production netlist 192, as part of a process of generating a corrected production netlist 198, in accordance with embodiments of the invention, as described herein.

Logic identifier 130 automatically generates a list 195 of gates, nets, and/or connections in production netlist 192 that correspond to flawed driving logic of the fixed cells, based on an input root point list 194. The list of driving nets 195 is used, for example, to reduce the number of gates that are to be replaced in the automated correction process. The fixed cells are preserved by the re-synthesis process and allow straight-forward correlation between re-synthesized netlist 193 and production netlist 192.

In some embodiments, root point list 194 may be provided (e.g., manually) as input to logic identifier 130. Logic identifier 130 identifies flawed logic in production netlist 192, including logic function of root points, and generates a list of input pins associated with the fixed cells defined by the list of root points 194. The list of gates 195 produced by logic identifier 130 includes the logic function of the root points and/or fixed cells whose driving logic requires reconstruction.

Logic cloner 140 automatically generates a list of gates, nets, and/or connections in the re-synthesized netlist 193 that make up logic cones corresponding to the identified driving logic of list 195. For example, in some embodiments, logic cloner 140 identifies driving logic cones in the re-synthesized netlist 192 for root points corresponding to the root points of list 194. Since root points 194 defining the fixed cells are based on manually identified elements, root points 194 in re-synthesized netlist 193 correspond to root points 194 in production netlist 192. In some embodiments, logic cloner 140 may implement a recursive algorithm, for example, as discussed herein with reference to FIG. 8.

Logic cloner 140 may produce cloned logic 196, which includes logic cones corresponding to the correct logic in the re-synthesized netlist 193, to replace the flawed logic identified in the production netlist 192. In some embodiments, logic cloner 140 modifies the names of the generated gates and nets in the logic cones of cloned logic 196, for example, by adding unique suffixes and/or using a hierarchal naming scheme, to avoid possible conflicts with similar elements already existing in the production netlist 192.

In some embodiments, logic remover 150 automatically removes flawed logic from the production netlist 192, for example, by deleting or disconnecting one or more elements. In some embodiments, logic remover 150 may implement a recursive algorithm, for example, as discussed herein with reference to FIG. 7. Logic remover 150 deletes substantially all the gates and nets that participate in logic cones that drive the flawed root points defined by root point list 194, if the same gates and nets do not participate in other logic cones. Alternatively, if one or more gates and nets that participate in a driving logic cone also participate in other logic cones, which are not included in the root point list 194, those gates and nets are disconnected only from the flawed logic cone and are not entirely deleted.

Based on the cloned logic 196, logic inserter 160 automatically adds to production netlist 192 gates and wires of the relevant logic cones being corrected, to generate a corrected netlist 198. The corrected netlist 198 corresponds to, and/or is substantially logically equivalent to, the high-level design fix 191.

Optionally, in some embodiments, system 100 is used to evaluate the impact of a possible gate level modification on a netlist, for example, in terms of the number of gates to be removed, new wiring required, or the like, without actually modifying the active production netlist. This evaluation is presented, for example, in the form of a list of changes to be performed on the production netlist at substantially any given stage. The evaluation process further provides statistics of added gates and/or removed gates, as well as and detailed logs or lists of the required modifications. Therefore, in some embodiments, the evaluation process provides a "dry run" of the modification tools, for example, to obtain statistics and to evaluate the magnitude of modifications required in the netlist.

Figure 2:
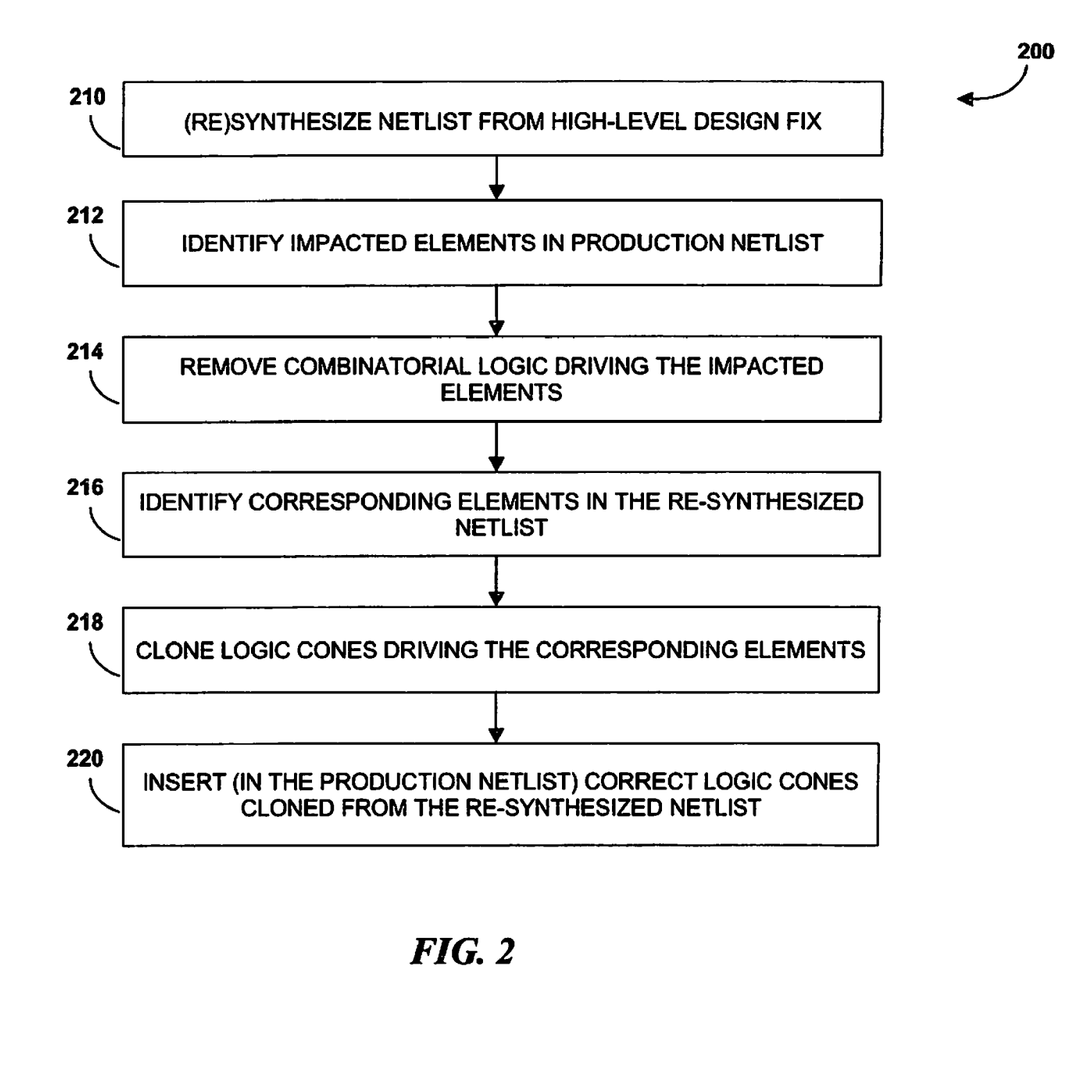
FIG. 2 is a schematic flow-chart of a method of automated gate level correction in accordance with some demonstrative embodiments of the invention.

FIG. 2 is a schematic flow-chart illustration of a method 200 of automated gate-level correction in accordance with some demonstrative embodiments of the invention. Operations of method 200 may be implemented, for example, by system 100 of FIG. 1, and/or by other suitable units, devices, and/or systems. In some embodiments, the method of FIG. 2 may be used, for example, for automated gate-level corrections in ASIC design flow.

Referring to block 210, method 200 may include synthesizing or re-synthesizing a netlist from a high-level design correction. In some embodiments, the re-synthesized netlist is a partial netlist of the circuit, for example, reflecting only the relevant modified logic from the high-level design. The re-synthesized netlist is used, for example, for logical Boolean equivalency validation. Furthermore, in accordance with embodiments of the invention, corrected logic elements of the re-synthesized netlist are utilized for automatic correction of an active netlist as described herein.

Referring to block 212, method 200 may include identifying one or more elements, such as memory elements, macros, or the like, in an active production netlist that are impacted or affected by the functional correction as defined in the high-level design. Such elements correspond to flawed logic in the production netlist. Method 200 identifies flawed logic cones associated with one or more root points, where the driving logic is functionally flawed and requires correction and/or replacement. In some embodiments, identified elements are based on a possible correction, as opposed to actual correction, to the circuit design, for example, for evaluation purposes.

Referring to block 214, method 200 may include extracting or removing combinatorial logic or logic cones that drive the identified elements. For example, one or more gates of a logic cone having an output that corresponds to a root point are removed. In some embodiments, method 200 generates a list of extracted gates and wires in a logic deletion script format for automated gate level corrections. For example, the logic deletion script may be based on gate deletion and wiring removal commands of a suitable Electronic Design Automation (EDA) tool that provides low-level netlist manipulation capabilities. The logic deletion script is applied to the production netlist to remove or to disconnect driving logic of flawed logic cones. Gates that are exclusive to the flawed logic cone are removed; whereas gates of the flawed logic cone that are also associated with correct logic cones (i.e., logic cones that can build logic for non-root points) are preserved. In some embodiments, a recursive algorithm may be used for logic removal, as described herein with reference to FIG. 7.

Referring to block 216, method 200 may include identifying one or more elements in the re-synthesized netlist that correspond to the elements identified in the production netlist. For example, method 200 identifies driving logic cones relating to one or more root points in the re-synthesized netlist that correspond to the root points in the production netlist. The elements in the re-synthesized netlist correspond to corrected logic, based on the high-level design fix, to replace the flawed logic in the production netlist. For example, a logic cone of the re-synthesized netlist having an output at a root point and including corrected driving logic is extracted for cloning.

Referring to block 218, method 200 may include cloning one or more logic cones from the re-synthesized netlist that contribute to one or more logical functions of a root point being corrected. In some embodiments, method 200 generates a list of corrected gates and wires from the identified logic cones in a logic construction script format for automated gate level corrections. For example, the logic construction script is based on gate creation and wiring commands of a suitable EDA tool that provides low-level netlist manipulation capabilities. The logic construction script is applied to the production netlist to clone the corrected logic cones. In some embodiments, logic cone construction or cloning may be performed using a sequence of operations, for example, including a recursive algorithm as described herein with reference to FIG. 8.

Figure 6:
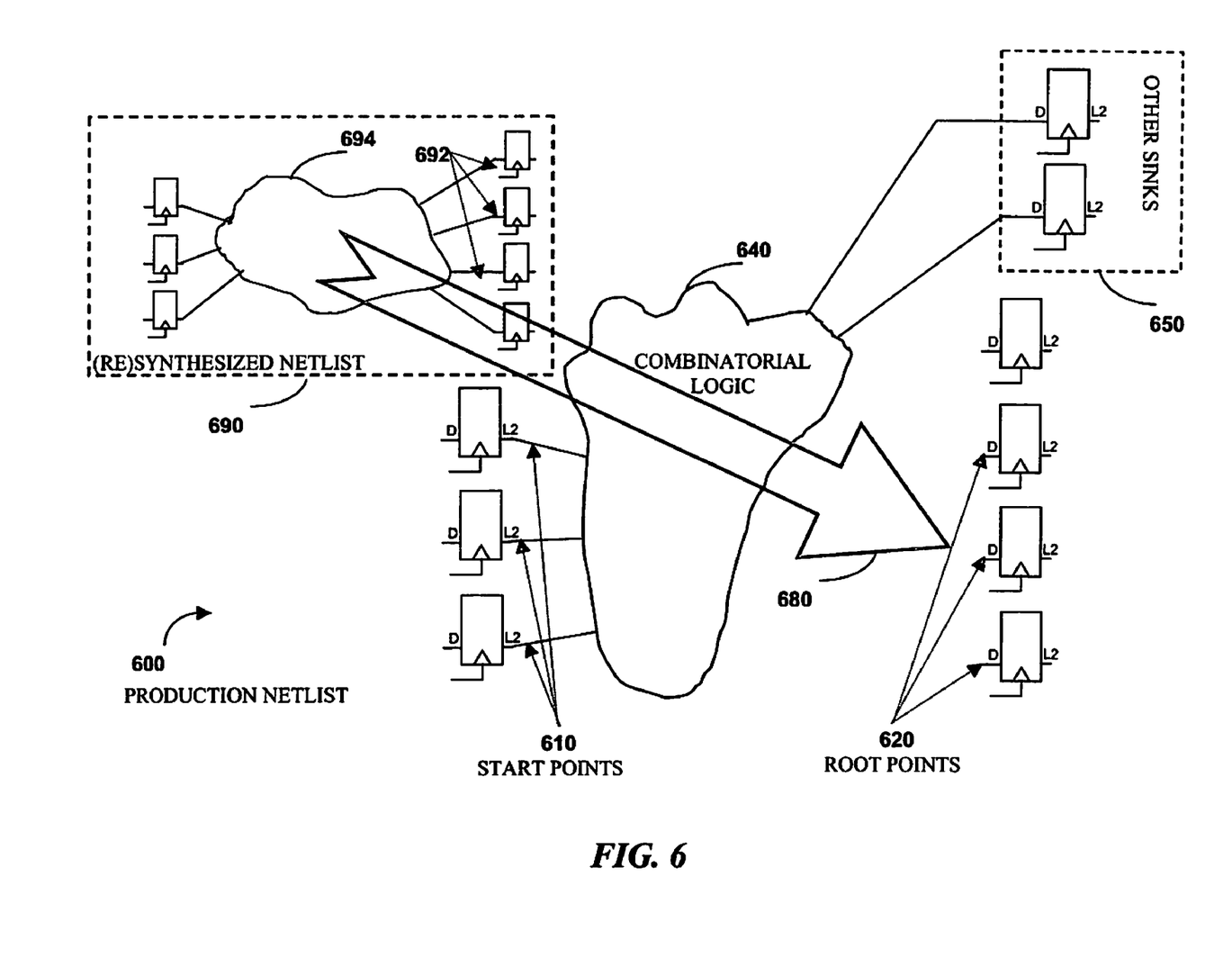
FIG. 6 is a schematic diagram of logic cone construction and cloning for automated gate level correction in accordance with some demonstrative embodiments of the invention.

Referring to block 220, method 200 may include inserting or creating correct logic cones into the production netlist based on the cloned logic from the re-synthesized netlist, for example, as described herein with reference to FIG. 6. The corrected logic of the cloned logic cones is inserted as driving logic at the root points, to replace flawed gates previously removed during logic deletion.

Other suitable operations or sets of operations may be used in accordance with embodiments of the invention. In addition, the operations described above are not limited to any particular order of operations. In some embodiments, for example, one or more operations of method 200 may be performed substantially in parallel or sequentially, as appropriate.

Figure 3:
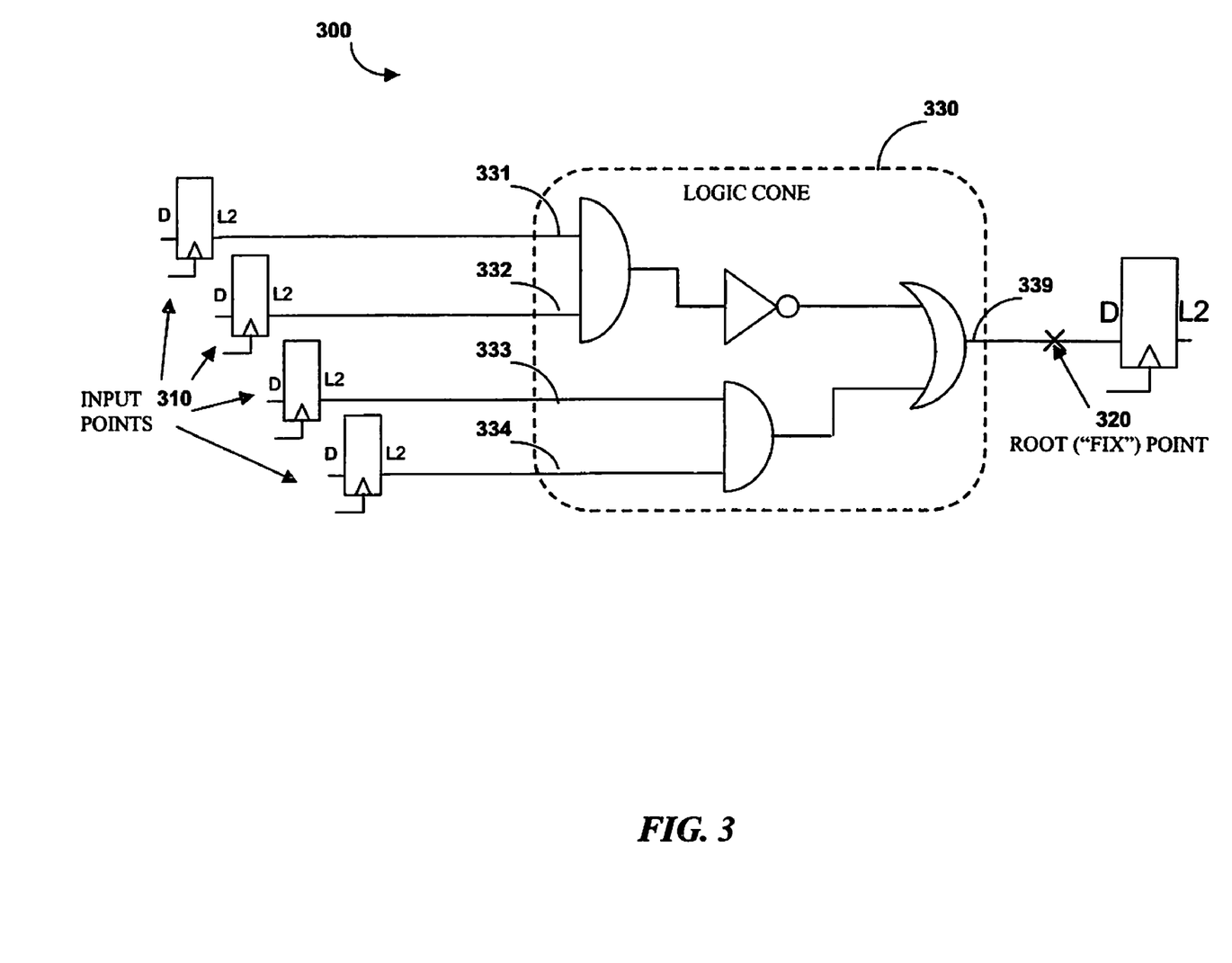
FIG. 3 is a schematic diagram of a logic cone in accordance with some demonstrative embodiments of the invention.

FIG. 3 is a schematic diagram of a logic cone 330 in accordance with some demonstrative embodiments of the invention. Logic cone 330 may be a part of, or may be included in, a netlist 300 such as, for example, production netlist 192 of FIG. 1, re-synthesized netlist 193 of FIG. 1, corrected netlist 198 of FIG. 1, or the like.

Logic cone 330 may include or may correspond to multiple combinatorial gates and/or wires in a cluster that encompasses the logical function of a reference point at the logic cone output, for example, at an output 399. The logic cone 330 may be associated with multiple inputs, for example, logic cone inputs 331-334.

The logic cone inputs are driven by input points 310, which may include easily identifiable elements of netlist 300, for example, elements associated with root points included in root point list 194 of FIG. 1. Input points 310 may include elements that are easily cross-referenced between a reference netlist and an active netlist, for example, between the re-synthesized netlist 193 of FIG. 1 and the production netlist 192 of FIG. 1.

In some embodiments, netlist 300 may include a root point 320 at the logic cone output. Accordingly, the logic driving root point 320, including logic cone 330, may be functionally flawed and may require replacement, modification, or correction.

Figure 4:
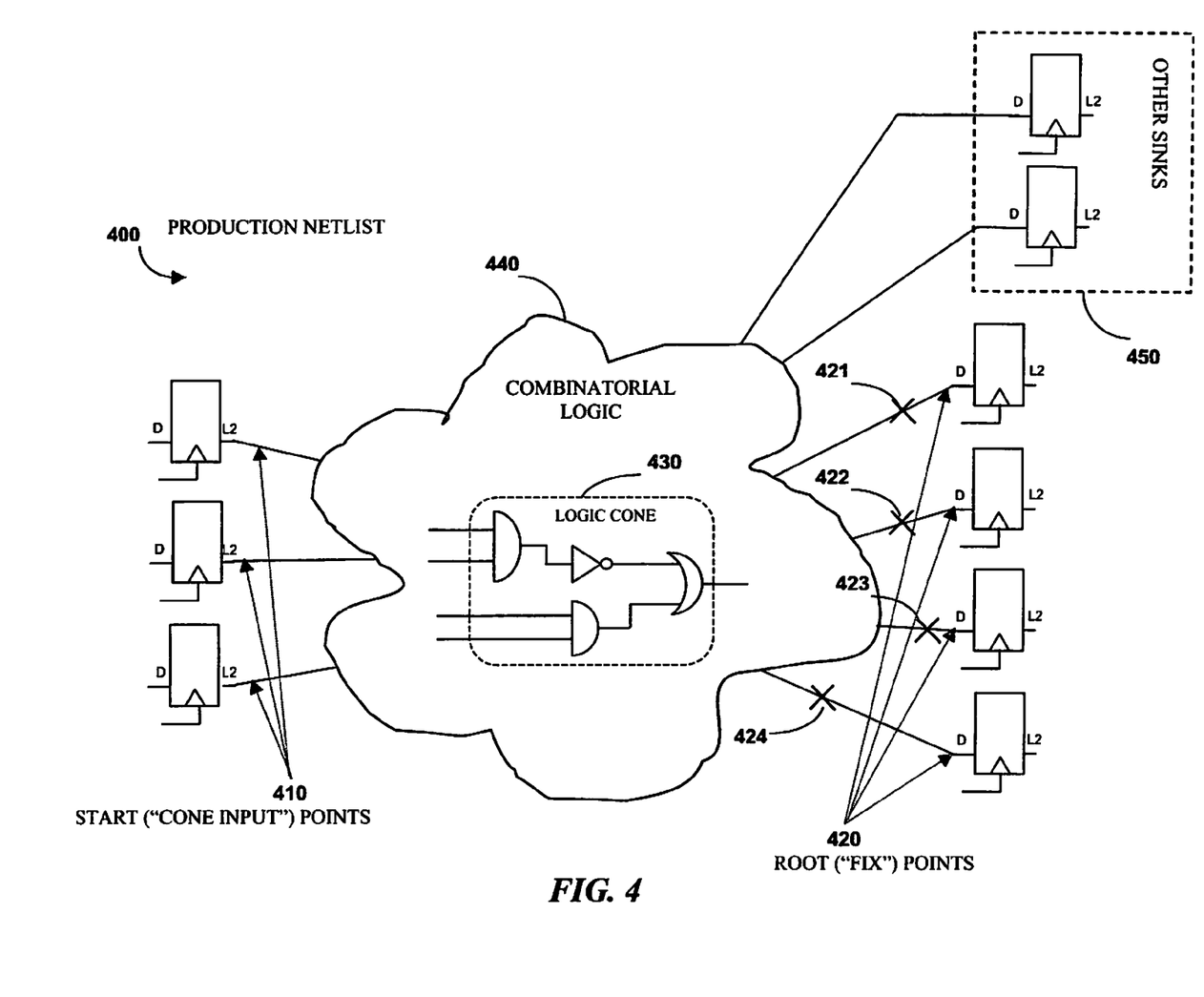
FIG. 4 is a schematic diagram of logic cone removal for automated gate level correction in accordance with some demonstrative embodiments of the invention.

FIG. 4 is a schematic diagram of logic cone removal for automated gate-level correction in accordance with some demonstrative embodiments of the invention. FIG. 4 shows a portion of a production netlist 400, with start points 410, root points 420, and a combinatorial logic 440 there between, including one or more logic cones 430. Also shown in FIG. 4 are one or more sinks 450 of netlist 400. FIG. 4 schematically illustrates removal of nets 421-424, and of one or more logic cones 430, from combinatorial logic 440. The combinatorial logic resulting from a corrected re-synthesized netlist based on production netlist 400, with inserted and/or cloned logic, for example, replacing nets 421-424 and their driving logic cones, is described herein with reference to FIG. 6.

Figure 5:
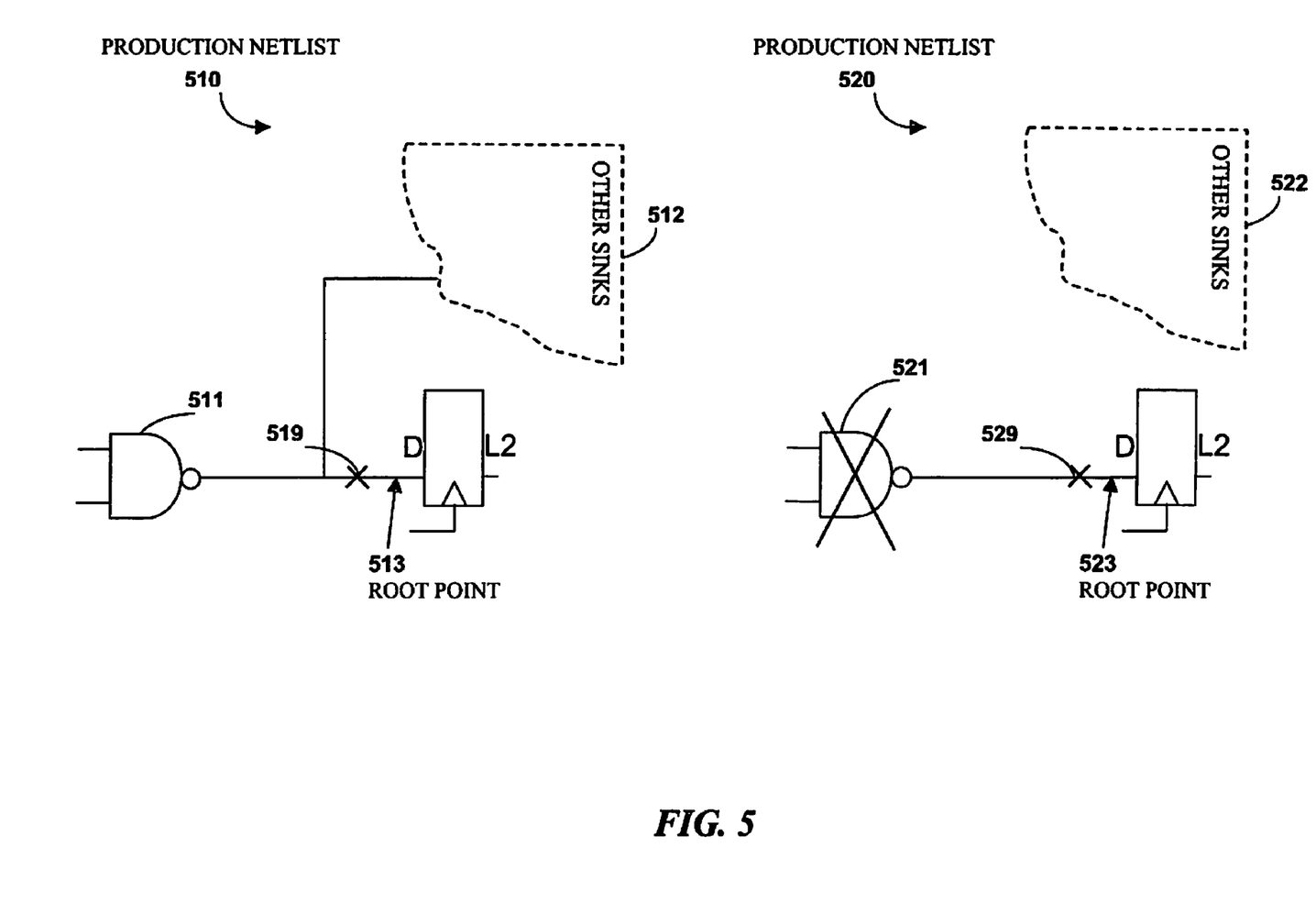
FIG. 5 is a schematic diagram of combinatorial logic removal for automated gate level correction in accordance with some demonstrative embodiments of the invention.

FIG. 5 is a schematic diagram of combinatorial logic removal for automated gate-level correction in accordance with some demonstrative embodiments of the invention. FIG. 5 shows two partial examples of a netlist, namely a netlist 510 and a netlist 520, to which combinatorial logic removal may be applied, for example, in an automated gate level correction procedure. In netlist 510, an input wire 519 is disconnected from a root point 513. However, a source gate 511 is connected to or associated with other sinks 512, and thus the source gate 511 is not deleted. In netlist 520, an input wire 529 is disconnected from a root point 529. In addition, a source gate 521 is not connected to or associated with other sinks 522, and thus the source gate 521 may be deleted.

FIG. 6 is a schematic diagram of logic cone construction and cloning for automated gate level correction in accordance with some demonstrative embodiments of the invention. FIG. 6 shows a portion of a production netlist 600 with start points 610, root points 620, and a combinatorial logic 640 there between. Also shown in FIG. 6 are one or more sinks 650 of netlist 600. Combinatorial logic 640 represents changes or modifications to the combinatorial logic 440 of FIG. 4, after removal of nets 421-424, for example, after deletion or disconnection as shown in FIG. 5.

In addition, FIG. 6 shows a portion of a re-synthesized netlist 690, including a combinatorial logic 694, which may include corrected logic corresponding to a high-level design fix of the circuit design. As indicated by arrow 680, logic 694 may be cloned from re-synthesized netlist 690, for example, by a logic cloner such as cloner 140 of FIG. 1, and inserted into production netlist 600. Re-synthesized netlist 690 includes reference root points 692 which correlate with root points 620 and/or root points 420 of netlists 600 and 400 respectively, indicating the locations where the corrected logic may be inserted by a logic inserter, such as inserter 160 of FIG. 1.

Figure 7:
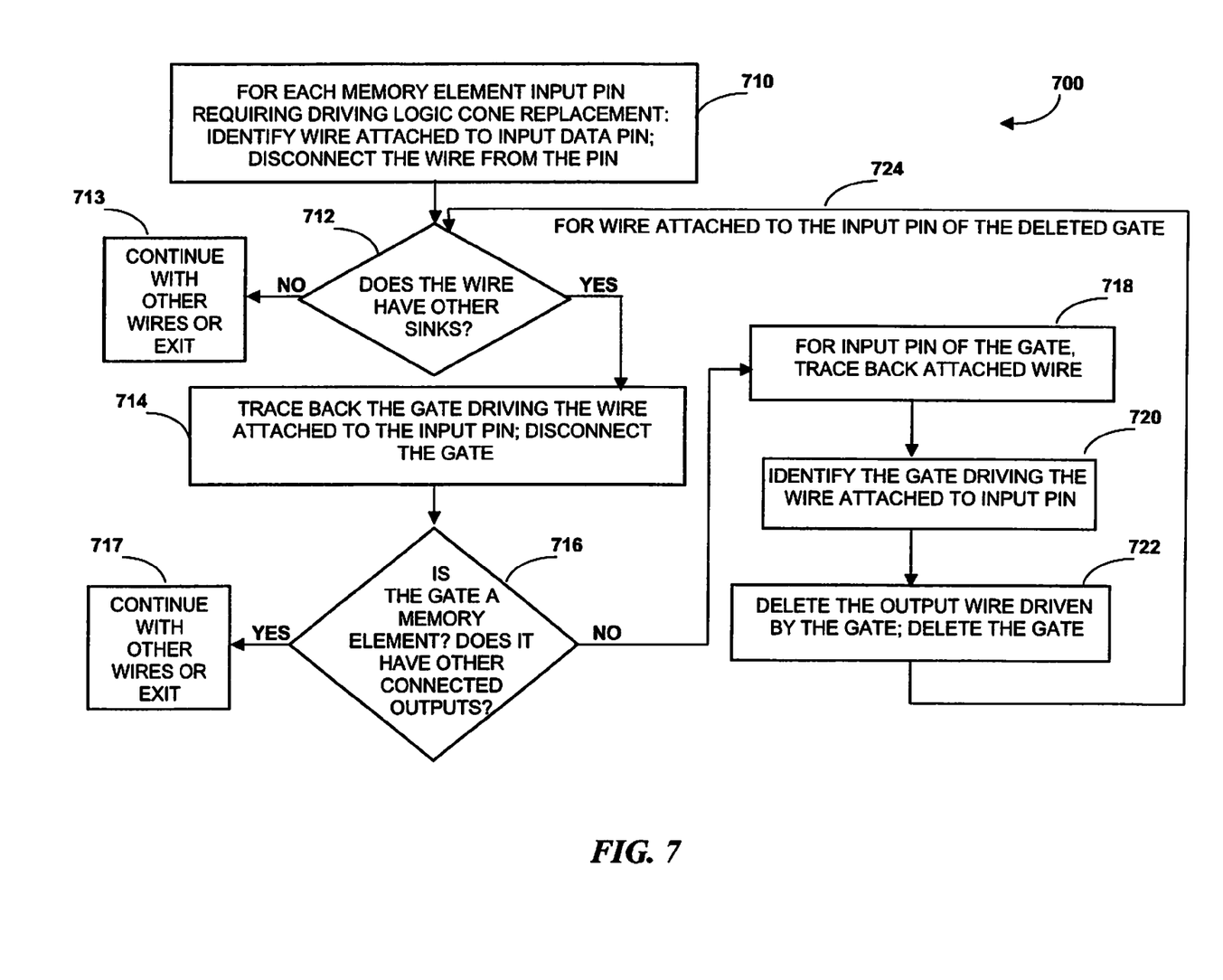
FIG. 7 is a schematic flow-chart of a method of recursive logic removal in accordance with some demonstrative some embodiments of the invention.

FIG. 7 is a schematic flow-chart illustration of a method 700 of recursive logic removal in accordance with some demonstrative embodiments of the invention. Operations of method 700 may be implemented, for example, by system 100 of FIG. 1, and/or by other suitable units, devices, and/or systems. In some embodiments, for example, the subroutine of block 214 of FIG. 2 may be implemented using the method of FIG. 7.

Referring to block 710, method 700 may be performed for substantially each memory element input pin requiring driving logic cone replacement, for example, for the one or more impacted or affected elements identified at block 212 of FIG. 2. The memory element input pin may correspond to a root point from root point list 194 of FIG. 1. In some embodiments, method 700 includes identifying at least one wire attached to an input data pin of an impacted element, and disconnecting that wire (the "current wire") from the input pin.

Referring to block 712, method 700 may include a determination of whether or not the current wire has other sinks attached. If the current wire does not have other sinks attached, then method 700 continues with other wires, or exits (block 713). If there are other sinks attached to the current wire (block 714), then method 700 includes tracing back to the gate driving the current wire, and further disconnecting that gate (the "current gate").

Referring to block 716, method 700 may include determining whether the current gate is a memory element or has other connected outputs. If either of these conditions is true, method 700 continues with other wires, or exits (block 717). Alternatively, if the conditions are false (block 718), that is, if the gate is a memory element with additional connected outputs, method 700 includes tracing back a wire that is connected to an input pin of the current gate.

Referring to block 720, method 700 may include identifying a gate that is driving the wire connected to the input pin; as well as deleting the output wire driven by the gate (block 722) and further deleting the gate (block 722).

Referring to arrow 724, method 700 may include a recursive portion where, for a wire used to attach to an input pin of a deleted gate, operations of method 700 are repeated as from block 712 with a determination of whether the wire has other sinks attached. The recursive portion of method 700 removes a logic sub-cone that drives the input pin of the current gate being removed.

Other suitable operations or sets of operations may be used in accordance with embodiments of the invention.

Figure 8:
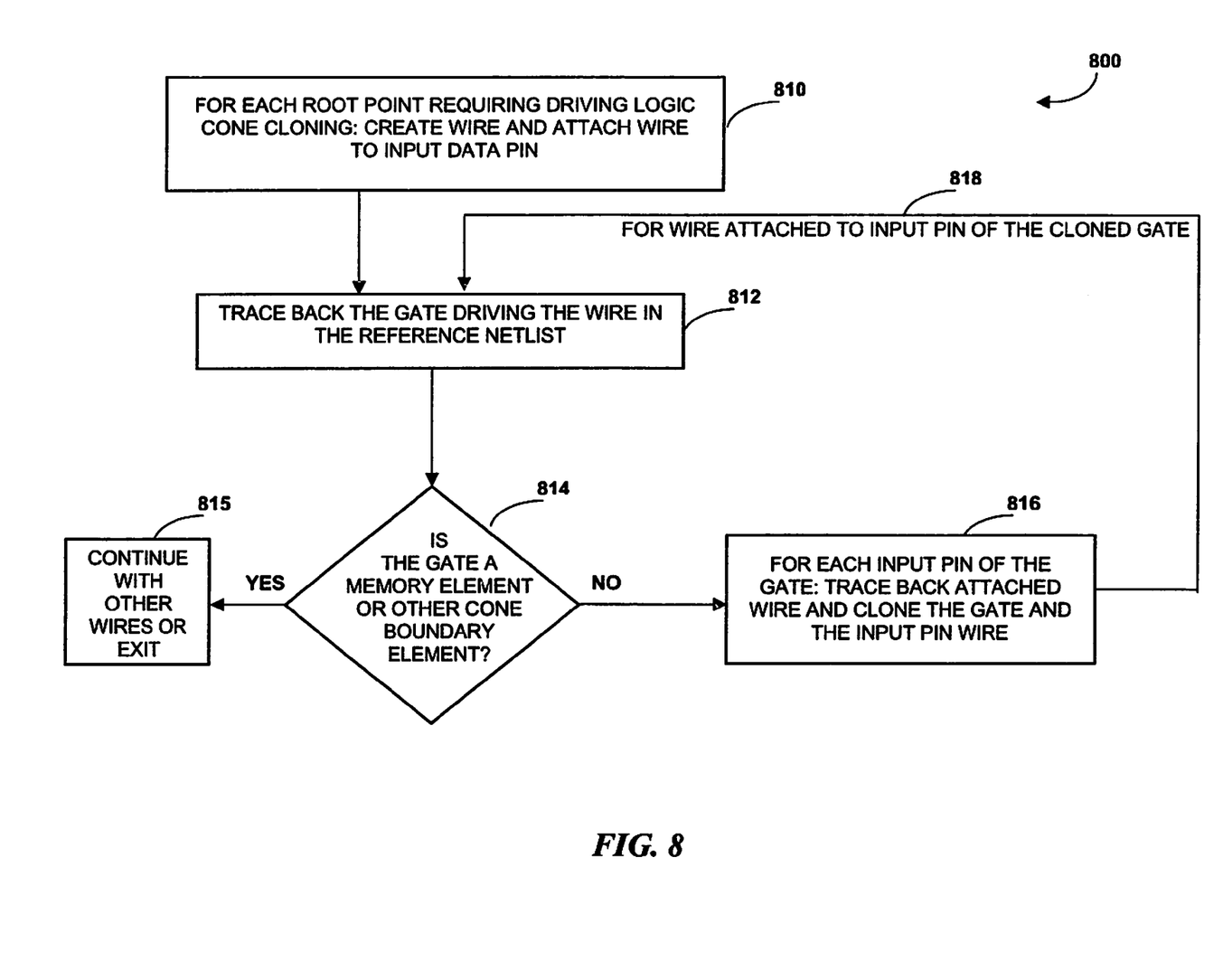
FIG. 8 is a schematic flow-chart of a method of recursive logic cloning and logic cone construction in accordance with some demonstrative embodiments of the invention.

FIG. 8 is a schematic flow-chart illustration of a method 800 of logic cloning and logic cone construction in accordance with some demonstrative embodiments of the invention. Operations of method 800 may be implemented, for example, by system 100 of FIG. 1, and/or by other suitable units, devices, and/or systems. In some embodiments, for example, the subroutine of block 218 of FIG. 2 may be implemented using the method of FIG. 8.

Referring to block 810, method 800 may be performed for substantially each root point requiring driving logic cone cloning in a reference netlist. For example, method 800 may be performed for the one or more of the "corresponding elements" identified at block 216 of FIG. 2. The root point used for logic cloning may be a correlated root point of the re-synthesized netlist that corresponds to a root point of the active netlist used for logic removal, for example, as described in FIG. 7 herein.

In some embodiments, as indicated at block 810, method 800 may include copying a reference wire attached to an input data pin of the current element, and attaching a cloned wire to the corresponding input pin in the active netlist.

Referring to block 812, method 800 may include tracing back to a gate driving the reference wire in the reference netlist (the "current reference gate"), and determining (block 814) whether the current reference gate is a memory element or other logic cone boundary element. If the condition is true, that is, if a cone boundary is reached, then method 800 continues with other wires, or exits (block 815).

Alternatively, if the condition is false (block 816), that is, if the reference gate is a combinatorial logic element and not a logic cone boundary, then method 800 may include, for each input pin of the gate, tracing back a wire that is connected to an input pin of the current reference gate and cloning the gate together with the input pin wire. Cloned gates and wires are inserted to the active netlist, for example, via copying the logic elements and applying a unique naming scheme.

Referring to arrow 818, method 800 may include a recursive portion where, for each wire attached to an input pin of the gate being cloned, operations of method 800 are repeated as from block 812 with a trace back to a gate driving that wire. The recursive portion of method 800 clones a logic sub-cone that drives the input pin of the current gate being cloned.

Other suitable operations or sets of operations may be used in accordance with embodiments of the invention.

Some embodiments of the invention, for example, may take the form of an entirely hardware embodiment, an entirely software embodiment, or an embodiment including both hardware and software elements. Some embodiments may be implemented in software, which includes but is not limited to firmware, resident software, microcode, or the like.

Furthermore, some embodiments of the invention may take the form of a computer program product accessible from a computer-usable or computer-readable medium providing program code for use by or in connection with a computer or any instruction execution system. For example, a computer-usable or computer-readable medium may be or may include any apparatus that can contain, store, communicate, propagate, or transport the program for use by or in connection with the instruction execution system, apparatus, or device.

In some embodiments, the medium may be an electronic, magnetic, optical, electromagnetic, infrared, or semiconductor system (or apparatus or device) or a propagation medium. Some demonstrative examples of a computer-readable medium may include a semiconductor or solid-state memory, magnetic tape, a removable computer diskette, a random access memory (RAM), a read-only memory (ROM), a rigid magnetic disk, and an optical disk. Some demonstrative examples of optical disks include compact disk-read only memory (CD-ROM), compact disk-read/write (CD-R/W), and DVD.

In some embodiments, a data processing system suitable for storing and/or executing program code may include at least one processor coupled directly or indirectly to memory elements, for example, through a system bus. The memory elements may include, for example, local memory employed during actual execution of the program code, bulk storage, and cache memories which may provide temporary storage of at least some program code in order to reduce the number of times code must be retrieved from bulk storage during execution.

In some embodiments, input/output or I/O devices (including but not limited to keyboards, displays, pointing devices, etc.) may be coupled to the system either directly or through intervening I/O controllers. In some embodiments, network adapters may be coupled to the system to enable the data processing system to become coupled to other data processing systems or remote printers or storage devices, for example, through intervening private or public networks. In some embodiments, modems, cable modems and Ethernet cards are demonstrative examples of types of network adapters. Other suitable components may be used.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. A method of correcting an integrated circuit design, the method comprising:
   receiving a list of one or more root points for an active netlist requiring logic correction, wherein said one or more root points correlate between the active netlist and a re-synthesized netlist that is based on a high-level correction for said integrated circuit design;
   automatically identifying in the active netlist one or more flawed logic elements associated with at least one of said root points; and
   automatically identifying, using a computer, in the re-synthesized netlist one or more corrected logic elements that correspond to the one or more identified flawed logic elements.

2. The method of claim 1, wherein identifying the one or more flawed logic elements associated with said root point comprises identifying a driving logic cone of said root point.

3. The method of claim 1, wherein identifying the one or more corrected logic elements in the re-synthesized netlist comprises identifying a driving logic cone for a correlated root point of the re-synthesized netlist that is correlated with the root point associated with said one or more flawed logic elements.

4. The method of claim 1, comprising automatically correcting the active netlist based on the one or more corrected logic elements of the re-synthesized netlist.

5. The method of claim 4, wherein correcting the active netlist comprises removing one or more of the flawed logic elements from the active netlist and inserting one or more of the corrected logic elements into the active netlist.

6. The method of claim 5, wherein removing one or more of said flawed logic elements comprises deleting one or more of the flawed logic elements that are associated only with root points of the active netlist.

7. The method of claim 5, wherein removing one or more of said flawed logic elements comprises disconnecting one or more of the flawed logic elements from said root point that are also associated with non-flawed logic points in the active netlist.

8. The method of claim 4, further comprising cloning corrected logic from the re-synthesized netlist for insertion into the active netlist, wherein cloning includes copying one or more of the corrected logic elements from the re-synthesized netlist and applying a unique naming scheme to said one or more elements to be cloned.

9. The method of claim 4, wherein said list of one or more root points includes at least first and second root points corresponding to first and second, unrelated, portions of the active netlist, and wherein automatically correcting the active netlist comprises automatically correcting, substantially in parallel, flawed logic of said first and second portions of the active netlist, based on said first and second root points, respectively.

10. The method of claim 1, comprising evaluating potential modifications to the active netlist based on the one or more flawed logic elements identified in the active netlist and the one or more corrected logic elements identified in the re-synthesized netlist.

11. A computer program product comprising a computer storage medium that stores a computer readable program, wherein the computer readable program, when executed on a computer, causes the computer to:

receive a list of one or more root points for an active netlist requiring logic correction, wherein said one or more root points correlate between the active netlist and a re-synthesized netlist that is based on a high-level correction for said integrated circuit design;

automatically identify in the active netlist a driving logic cone for at least one of said root points, including one or more flawed logic elements associated with said root point; and automatically identify in the re-synthesized netlist a driving logic cone, including one or more corrected logic elements that correspond to the one or more identified flawed logic elements, for a root point of the re-synthesized netlist that is respectively correlated with the root point associated with said one or more flawed logic elements in the active netlist.

12. The computer program product of claim 11, wherein the computer readable program, when executed on a computer, causes the computer to automatically correct the active netlist based on the one or more corrected logic elements of the re-synthesized netlist, by removing one or more of the flawed logic elements from the active netlist and inserting one or more of the corrected logic elements into the active netlist.

13. The computer program product of claim 12, wherein removing one or more of said flawed logic elements comprises deleting one or more flawed logic elements that are associated only with root points of the active netlist.

14. The computer program product of claim 12, wherein removing one or more of said flawed logic elements comprises disconnecting one or more of said flawed logic elements from said root point that are further associated with non-flawed logic in the active netlist.

15. The computer program product of claim 12, wherein said list of one or more root points includes at least first and second root points corresponding to first and second, unrelated, portions of the active netlist, and wherein the computer readable program, when executed on a computer, causes the computer to automatically correct substantially in parallel, flawed logic of said first and second portions of the active netlist, based on said first and second root points, respectively.

16. The computer program product of claim 11, wherein the computer readable program, when executed on a computer, causes the computer to clone corrected logic from the re-synthesized netlist for insertion into the active netlist, by copying one or more of the corrected logic elements from the re-synthesized netlist and applying a unique naming scheme to said one or more elements to be cloned.

17. The computer program product of claim 11, wherein at least part of the computer readable program is implemented using a tool command language script.

18. An apparatus for automated gate level correction of an integrated circuit design, the apparatus comprising:

an input unit configured to receive a list of one or more root points for an active netlist requiring logic correction, wherein said one or more root points correlate between the active netlist and a re-synthesized netlist that is based on a high-level correction for said integrated circuit design; and a processor configured to automatically identify in the active netlist a driving logic cone for at least one of said root points, including one or more flawed logic elements associated with said root point and to automatically identify in the re-synthesized netlist a driving logic cone, including one or more corrected logic elements that correspond to the one or more identified flawed logic elements, for a root point of the re-synthesized netlist that is respectively correlated with the root point associated with said one or more flawed logic elements in the active netlist.

19. The apparatus of claim 18, wherein the processor is configured to automatically correct the active netlist based on the one or more corrected logic elements of the re-synthesized netlist, by removing one or more of the flawed logic elements from the active netlist and inserting one or more of the corrected logic elements into the active netlist.

20. The apparatus of claim 19, wherein said list of one or more root points includes at least first and second root points corresponding to first and second, unrelated, portions of the active netlist, and wherein the processor is configured to automatically correct, substantially in parallel, flawed logic of said first and second portions of the active netlist, based on said first and second root points, respectively.

* * * * *